United States Patent
Park et al.

(10) Patent No.: US 8,642,991 B2
(45) Date of Patent: Feb. 4, 2014

(54) PHOTOSENSITIVE QUANTUM DOT, COMPOSITION COMPRISING THE SAME AND METHOD OF FORMING QUANTUM DOT-CONTAINING PATTERN USING THE COMPOSITION

(75) Inventors: Jong-jin Park, Yongin-si (KR); Kwang-hee Lee, Suwon-si (KR); Won-jae Joo, Songnam-si (KR); Xavier Bulliard, Yongin-si (KR); Yun-hyuk Choi, Seoul (KR); Kwang-sup Lee, Daejeon (KR)

(73) Assignee: Samsung Electronics Co., Ltd. (KR)

( * ) Notice: Subject to any disclaimer, the term of this patent is extended or adjusted under 35 U.S.C. 154(b) by 573 days.

(21) Appl. No.: 12/480,204

(22) Filed: Jun. 8, 2009

(65) Prior Publication Data

US 2010/0117110 A1    May 13, 2010

(30) Foreign Application Priority Data

Nov. 11, 2008 (KR) .................. 10-2008-0111861
Mar. 13, 2009 (KR) .................. 10-2009-0021863

(51) Int. Cl.
*H01L 33/00* (2010.01)

(52) U.S. Cl.
USPC ......... 257/13; 977/834; 257/17; 257/E33.006

(58) Field of Classification Search
USPC ...................................... 257/13, 17, E33.006
See application file for complete search history.

(56) References Cited

U.S. PATENT DOCUMENTS

| | | | |
|---|---|---|---|
| 6,639,039 B1 * | 10/2003 | Fries et al. ............ | 528/32 |
| 7,199,393 B2 | 4/2007 | Park et al. | |
| 7,235,190 B1 * | 6/2007 | Wilcoxon et al. ....... | 252/301.6 S |
| 7,374,807 B2 * | 5/2008 | Parce et al. ............. | 428/76 |
| 2005/0250052 A1 | 11/2005 | Nguyen | |
| 2006/0083694 A1 * | 4/2006 | Kodas et al. ............. | 424/46 |
| 2006/0194057 A1 * | 8/2006 | Pfluecker et al. ....... | 428/404 |
| 2006/0199039 A1 | 9/2006 | Park et al. | |
| 2008/0110494 A1 | 5/2008 | Reddy | |

FOREIGN PATENT DOCUMENTS

| | | |
|---|---|---|
| JP | 2003-332199 A | 11/2003 |
| KR | 1020040106604 A | 12/2004 |
| KR | 1020050038120 A | 4/2005 |
| KR | 1020060103356 A | 9/2006 |
| KR | 1020080017149 A | 2/2008 |

OTHER PUBLICATIONS

S. Jun et al., Photopatterned Semiconductor Nanocrystals and Their Electroluminescence from Hybrid Light-Emitting Devices, American Chemical Society, Langmuir, 2006, vol. 22, pp. 2407-2410.
T.A. Pham et al., Three-Dimensional SiCN Ceramic Microstructures via Nano-Stereolithography of Inorganic Polymer Photoresists, Advanced Functional Material, 2006, vol. 16, pp. 1235-1241.
P. N. Prasad, Nanophotonics, Wiley-Interscience, 2004, pp. v-xv.
Dong-Yol Yang et al., Corrected Article: "Ultraprecise microreproduction of a three-dimensional artistic sculpture by multipath scanning method in two-photon photopolymerization", Applied Physics Letter, vol. 90, 013113, 2007, pp. 1-3.
Z. Tan et al., Colloidal nanocrystal-based light-emitting diodes fabricated on plastic toward flexible quantum dot optoelectronics, Journal of Applied Physics, 2009, vol. 105, pp. 1-5.
Q. Sun et al., Bright, multicoloured light-emitting diodes based on quantum dots, Nature Photonics, vol. 1, Nov. 18, 2007, pp. 717-722.

* cited by examiner

*Primary Examiner* — Anthony Ho
(74) *Attorney, Agent, or Firm* — Cantor Colburn LLP

(57) ABSTRACT

A photosensitive quantum dot including a quantum dot, and a plurality of photosensitive moieties that are bound to a surface of the quantum dot, wherein each of the photosensitive moieties includes silicon (Si) and a photosensitive functional group. Also disclosed are a composition for forming a quantum dot-containing pattern, where the composition includes the photosensitive quantum dot, and a method of forming a quantum dot-containing pattern using the composition.

18 Claims, 2 Drawing Sheets

PHOTOSENSITIVE QUANTUM DOT, COMPOSITION COMPRISING THE SAME AND METHOD OF FORMING QUANTUM DOT-CONTAINING PATTERN USING THE COMPOSITION

CROSS-REFERENCE TO RELATED APPLICATIONS

This application claims priority to Korean Patent application No. 10-2008-0111861, filed on Nov. 11, 2008, and Korean Patent application No. 10-2009-0021863, filed on Mar. 13, 2009, and all the benefits accruing therefrom under 35 U.S.C. §119, the contents of which in their entirety are herein incorporated by reference.

BACKGROUND

1. Field

The following disclosure relates to a photosensitive quantum dot, a composition including the quantum dot, and a method of forming a quantum dot-containing pattern using the composition. More particularly, this disclosure relates to a photosensitive quantum dot in which a plurality of photosensitive moieties, each including silicon (Si) and a photosensitive functional group, are bound to a surface of the photosensitive quantum dot. This disclosure further relates to a composition for forming a quantum dot-containing pattern, including the photosensitive quantum dot having a plurality of photosensitive moieties and a method of forming a quantum dot-containing pattern by using the composition.

2. Description of the Related Art

In general, the chemical and physical properties of solid crystals are not related to the size of the crystals. However, if the size of the solid crystals is in the range of several nanometers, then the size of the crystals may become a factor in determining the chemical and physical properties of the solid crystals. In nano-technologies, research relating to the quantum dot has been actively conducted worldwide. Quantum dots having a size of about several nanometers have unique properties such as, for example, quantum effects. Quantum dots of this size are known to be used in semiconductor structures for producing highly efficient light emitting devices and for luminescence labeling of molecules in the living body.

Recently, a chemical wet-process in which a precursor material is added to an organic solvent in order to grow quantum dots having a variety of sizes has been used. According to the chemical wet-etching method, as the quantum dot crystals are grown the organic solvent is coordinated to a surface of the quantum dot crystals to act as a dispersant. Thus, the growth of the quantum dots can be controlled to a nano-scale size. In addition, various sizes of quantum dots may be homogeneously synthesized by appropriately controlling the concentration of the precursor material used, the type of the organic solvent, the synthesis temperature and the synthesis time.

However, quantum dots synthesized using the chemical wet-etching method are generally dispersed in an organic solvent such as, for example, toluene or chloroform, and thus, in order to use quantum dots in electric devices, there is a need to develop a thin film technology and a method of forming a pattern for forming a quantum dot thin film only on a portion of a substrate.

SUMMARY

One or more exemplary embodiments include a photosensitive quantum dot.

One or more exemplary embodiments include a composition for forming a quantum dot-containing pattern including the photosensitive quantum dot.

One or more exemplary embodiments include a method of forming a quantum dot-containing pattern by using the composition for forming a quantum dot-containing pattern.

One or more exemplary embodiments include a quantum dot-containing pattern including a photo-cured product of the photosensitive quantum dot.

One or more exemplary embodiments include an electric device including the quantum dot-containing pattern including a photo-cured product of the photosensitive quantum dot.

Additional aspects, advantages and features will be set forth in part in the description which follows and, in part, will be apparent from the description, or may be learned by practice of the disclosed exemplary embodiments.

To achieve the above and/or other aspects, one or more exemplary embodiments may include a photosensitive quantum dot including a quantum dot, and a plurality of photosensitive moieties that are bound to a surface of the quantum dot, wherein each of the photosensitive moieties includes Si and a photosensitive functional group.

To achieve the above and/or other aspects, one or more exemplary embodiments may include a composition for forming a quantum dot-containing pattern, the composition including an exemplary embodiment of the photosensitive quantum dot, a photoinitiator and a solvent.

To achieve the above and/or other aspects, one or more exemplary embodiments may include a method of forming a quantum dot-containing pattern, the method including preparing the composition for forming a quantum dot-containing pattern, applying the composition for forming a quantum dot-containing pattern on a substrate to prepare a quantum dot-containing film, selectively exposing the quantum dot-containing film to light, and developing the exposed quantum dot-containing film to obtain a quantum dot-containing pattern.

To achieve the above and/or other aspects, one or more exemplary embodiments may include a method of forming a quantum dot-containing pattern, the method including preparing a composition for forming a quantum dot-containing pattern, wherein the composition comprises a photosensitive quantum dot, a photoinitiator and a solvent, and wherein the photosensitive quantum dot comprises a quantum dot and a plurality of photosensitive moieties that are bound to a surface of the quantum dot, wherein each of the photosensitive moieties comprises silicon and a photosensitive functional group; applying the composition for forming a quantum dot-containing pattern on a substrate to prepare a quantum dot-containing film; selectively exposing the quantum dot-containing film to light and developing the exposed quantum dot-containing film to obtain a quantum dot-containing pattern.

To achieve the above and/or other aspects, one or more exemplary embodiments may include a quantum dot-containing pattern including the photo-cured product of the photosensitive quantum dot.

To achieve the above and/or other aspects, one or more exemplary embodiments may include a quantum dot-containing pattern including a photo-cured product of the photosensitive quantum dot, wherein the photosensitive quantum dot comprises a quantum dot and a plurality of photosensitive moieties that are bound to a surface of the quantum dot, wherein each of the photosensitive moieties comprises silicon and a photosensitive functional group.

To achieve the above and/or other aspects, one or more exemplary embodiments may include an electric device including the quantum dot-containing pattern including the photo-cured product of the photosensitive quantum dot.

BRIEF DESCRIPTION OF THE DRAWINGS

These and/or other aspects, advantages and features of exemplary embodiments of this disclosure will become apparent and more readily appreciated from the following description of the embodiments, taken in conjunction with the accompanying drawings of which.

Figure 1:
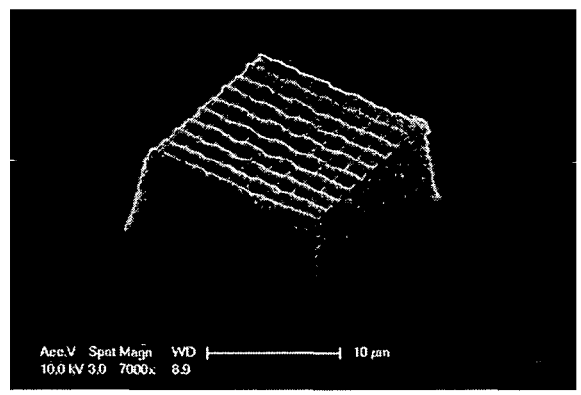
FIG. 1 is an image of a quantum dot-containing pattern having a three-dimensional shape, prepared in accordance with Example 1, using an exemplary embodiment of a photosensitive quantum dot.

The patent application file contains at least one drawing executed in color. Copies of this patent or patent application with color drawing(s) will be provided by the Office upon request and payment of the necessary fee.

DETAILED DESCRIPTION

This disclosure will now be described more fully hereinafter with reference to the accompanying drawings, in which embodiments of this disclosure are shown. The exemplary embodiments may, however, be embodied in many different forms and should not be construed as limited to the embodiments set forth herein. Rather, these embodiments are provided so that this disclosure will be thorough and complete, and will fully convey the concepts described herein to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings herein.

The terminology used herein is for the purpose of describing particular embodiments only and is not intended to limit the claims. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments of the present disclosure. As such, variations from the shapes of the illustrations as a result, for example, of manufacturing techniques and/or tolerances, are to be expected. Thus, embodiments of the present disclosure should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, the exemplary embodiments of this disclosure will be described in detail with reference to the accompanying drawings.

All methods described herein can be performed in a suitable order unless otherwise indicated herein or otherwise clearly contradicted by context. The use of any and all examples, or exemplary language (e.g., "such as"), is intended merely for illustration and does not pose a limitation on the scope of the disclosure unless otherwise claimed. No language in the specification should be construed as indicating that any non-claimed element is essential.

A photosensitive quantum dot according to an exemplary embodiment includes a quantum dot and a plurality of photosensitive moieties bound to a surface of the quantum dot. Each of the photosensitive moieties includes Si and a photosensitive functional group.

In an exemplary embodiment, the photosensitive moiety may be represented by Formula 1 or Formula 2 below:

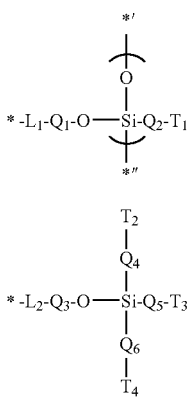

Formula 1

Formula 2

In Formula 1 and Formula 2, * is a binding site wherein the photosensitive moiety binds with the surface of the quantum dot.

In Formula 1 and Formula 2, $L_1$ and $L_2$ are each independently a linking group selected from the group consisting of —S—, —$R_1$—S—, —N=C—, —$R_1$=N—, —OOC—, —$R_1$—OOC— and —O—POO$R_1R_2$—. $R_1$ and $R_2$ may each independently be a hydrogen or —$(CH_2)_p$—, wherein p is an integer in the range of 1 to about 10.

In an exemplary embodiment, $L_1$ and $L_2$ may each independently be —S— or —$R_1$—S—, but $L_1$ and $L_2$ are not limited thereto.

$Q_1$ through $Q_6$ are each independently a single bond or a linking group of —$[C(R_3)(R_4)]_q$—. $R_3$ and $R_4$ may each independently be hydrogen, a $C_1$-$C_{20}$ alkyl group or —OH. In this regard, at least one of q numbers of —$C(R_3)(R_4)$— groups may be replaced with a group selected from the group consisting of —COO—, —NHCO—, —OCO—, —O— and —S—.

In one exemplary embodiment $R_3$ and $R_4$ may each independently be hydrogen, but $R_3$ and $R_4$ are not limited thereto.

In one exemplary embodiment, at least one —$C(R_3)(R_4)$— group of the q numbers of —$C(R_3)(R_4)$— groups may be replaced with —COO—, but is not limited thereto.

In exemplary embodiments of —$[C(R_3)(R_4)]_q$—, q is an integer in the range of 1 to about 20, or in the range of 1 to about 15, but q is not limited thereto.

In one exemplary embodiment of Formula 1, $T_1$ is a photosensitive functional group. In one exemplary embodiment of Formula 2, $T_2$ through $T_4$ are each independently hydrogen, a substituted or unsubstituted $C_1$-$C_{20}$ alkyl group, a substituted or unsubstituted $C_2$-$C_{20}$ alkenyl group, a substituted or unsubstituted $C_6$-$C_{14}$ aryl group or a photosensitive functional group. In exemplary embodiments of Formula 2 at least one of $T_2$ through $T_4$ is a photosensitive functional group. For example, one, two or three of $T_2$ through $T_4$ may be a photosensitive functional group.

In exemplary embodiments a substituent of the substituted $C_1$-$C_{20}$ alkyl group, the substituted $C_2$-$C_{20}$ alkenyl group, or the substituted $C_6$-$C_{14}$ aryl group may be selected from the group consisting of a hydroxyl group, a halogen atom, an amino group, a thiol group, a $C_1$-$C_{10}$ alkyl group and a $C_5$-$C_{16}$ aryl group.

That is, the photosensitive moiety of Formula 1 or Formula 2 includes at least one of a photosensitive functional group. Thus, when a quantum dot-containing pattern is formed using a photosensitive quantum dot having the photosensitive moiety of Formula 1 or Formula 2, the photosensitive functional group bound to the surface of the photosensitive quantum dot participates in a curing reaction. Accordingly, the curing efficiency may be increased, which results in a finer and more precise quantum dot-containing pattern in which the quantum dot is homogeneously distributed.

In exemplary embodiments the photosensitive functional group may further include a group that may participate in a crosslinking and/or curing reaction during exposure to light.

In one exemplary embodiment the photosensitive functional group may be represented by Formula 3 below.

—$CR_5$=$CR_6R_7$—  Formula 3

In Formula 3, $R_5$ through $R_7$ may each independently be a hydrogen, a $C_1$-$C_{10}$ alkyl group, a $C_2$-$C_{10}$ alkenyl group, a $C_5$-$C_{16}$ aryl group, a $C_1$-$C_{10}$ alkyl group substituted with at least one of a halogen atom, a $C_2$-$C_{10}$ alkenyl group substituted with at least one of a halogen atom, —CN, —COOH or an amino group.

For example, $R_5$ through $R_7$ may each independently be hydrogen or a $C_1$-$C_{10}$ alkyl group, but $R_5$ through $R_7$ are not limited thereto.

In Formula 1, *' refers to a binding site between a first photosensitive moiety of Formula 1 and an Si of an adjacent photosensitive moiety of Formula 1 and *'' refers to a binding site between the first photosensitive moiety of Formula 1 and an oxygen (O) of the an adjacent photosensitive moiety of Formula 1. It is to be understood that the term "adjacent" in reference to a photosensitive moiety of Formula 1 means a photosensitive moiety of Formula 1 that is located in sufficient proximity to the first photosensitive moiety of Formula 1 to allow bonding between the first photosensitive moiety of Formula 1 and the Si group and/or the 0 of the adjacent photosensitive moiety of Formula 1. It is further to be understood that the first photosensitive moiety of Formula 1 can be bonded to the same or different adjacent photosensitive moieties of Formula 1. In a specific embodiment, a first photosensitive moiety of Formula 1 is bonded to the Si of a second, adjacent photosensitive moiety of Formula 1, and the first photosensitive moiety of Formula 1 is bonded to the 0 of a third, adjacent photosensitive moiety of Formula 1.

That is, the Si of the first photosensitive moiety of Formula 1 may be bound to the Si of the second, adjacent photosensitive moiety of Formula 1, with an —O— positioned therebetween. The structure of the photosensitive quantum dot, the surface of which binds with the photosensitive moiety of Formula 1, is further described below with reference to Formula 4, Compound 1 and Compound 2.

The plurality of photosensitive moieties may be bound to the entire surface or to a portion of the surface of the quantum dot.

The photosensitive quantum dot has Si on the surface of the quantum dot. Thus, Si also exists in a quantum dot-containing pattern formed using the photosensitive quantum dot or in a surface of a quantum dot included in a quantum dot-containing pattern including a photo-cured product of the photosensitive quantum dot. The Si may prevent oxidation of the quantum dot during various operations of the quantum dot-containing pattern (for example, luminescence of the quantum dot-containing pattern). Thus, the light emitting efficiency of a quantum dot-containing pattern formed using the photosensitive quantum dot or a quantum dot-containing pattern including a photo-cured product of the photosensitive quantum dot may be maintained constant for a long period of time. Accordingly, electric devices including a quantum dot-containing pattern formed using the photosensitive quantum dot or a quantum dot-containing pattern including a photo-cured product of the photosensitive quantum dot may have excellent stability and reliability.

In addition, Si exists on the surface of the photosensitive quantum dot. Thus, the photosensitive quantum dot may have excellent dispersibility in a composition including the photosensitive quantum dot. Moreover, in exemplary embodiments the photosensitive quantum dot has the photosensitive functional group on the surface thereof. Thus, in exemplary embodiments the photosensitive functional group bound to the surface of the photosensitive quantum dot may participate in the crosslinking and/or curing reaction during exposure to light. Thus, the resolution of a quantum dot-containing pattern using the photosensitive quantum dot or a quantum dot-containing pattern including a photo-cured product of the photosensitive quantum dot may be controlled. In addition, if the distribution of the photosensitive quantum dot in the pattern described above is substantially uniform then the curing efficiency may increase.

In exemplary embodiments of the photosensitive quantum dot, the number of the photosensitive moieties bound to the surface of one quantum dot may vary according to the size of the quantum dot and the concentration of substituents. For example, the number of the photosensitive moieties bound to the surface of one quantum dot may be in the range of about 2 to about 30, or in the range of about 5 to about 15, but the number of the photosensitive moieties is not limited thereto. In an exemplary embodiment, the photosensitive quantum dot may be represented by Formula 4 or Formula 5 below.

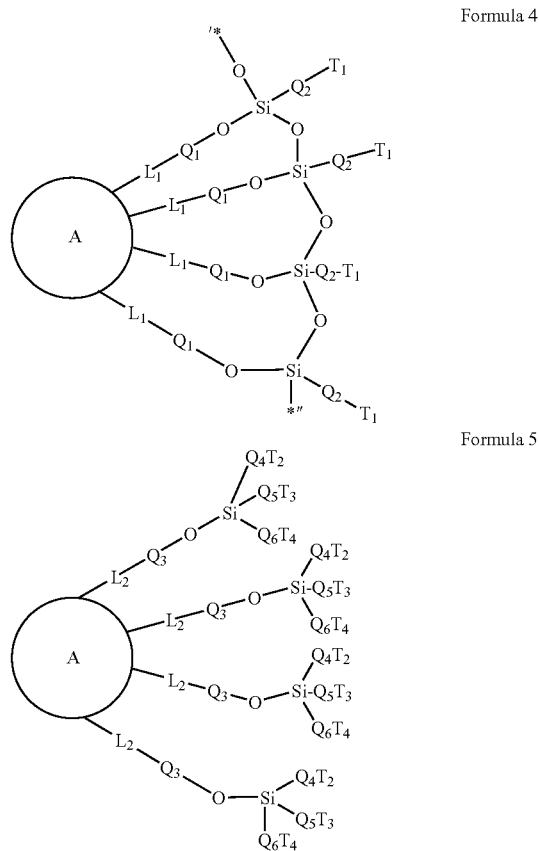

In Formula 4 and Formula 5, A denotes a quantum dot.

In Formula 4 and Formula 5, the detailed descriptions of $L_1$, $L_2$, $Q_1$ through $Q_6$ and $T_1$ through $T_4$ are the same as described above.

In Formula 4, *' refers to a binding site between a first photosensitive moiety and an Si of an adjacent photosensitive moiety, and *" refers to a binding site between the first photosensitive moiety and an O of an adjacent photosensitive moiety as described above.

In Formula 4 and Formula 5, only a few (e.g., 4 photosensitive moieties) of the possible photosensitive moieties, which are bound to the surface of the quantum dot represented by A, are illustrated for convenience of understanding. Thus, the photosensitive quantum dot is not limited to the number of photosensitive moieties illustrated in Formula 4 and Formula 5. In addition, one of ordinary skill in the art would understand that the additional photosensitive moieties, which are not illustrated in Formula 4 and Formula 5, may be three-dimensionally bound to the surface of the quantum dot represented by A. Therefore, in exemplary embodiments the photosensitive moieties may not all lie in the same plane but instead may be distributed over the entire surface of the quantum dot.

The quantum dot may be any known quantum dot synthesized using any known method for synthesizing quantum dots. For example, in one exemplary embodiment the quantum dot may be any quantum dot prepared using a metal precursor and a chemical wet process. For instance, in one exemplary embodiment the quantum dot may be prepared by injecting a metal precursor into an organic solvent and growing the crystals of the quantum dot at a constant temperature. In one exemplary embodiment the metal precursor is injected into the organic solvent in the presence of a dispersant. However, the preparation of the quantum dot is not limited thereto.

In exemplary embodiments the quantum dot may be a quantum dot of Group II-IV elements, Group II-IV elements, Group V elements, or mixtures thereof. The quantum dot may be a quantum dot of CdS, CdSe, CdTe, ZnS, ZnSe, ZnTe, HgS, HgSe, HgTe, GaN, GaP, GaAs, InP, InAs or mixtures thereof, but is not limited thereto. In addition, mixtures of at least two of the quantum dots described above may also be used. For example, the quantum dot may be a quantum dot mixture in which at least two quantum dots are simply mixed.

In one exemplary embodiment the quantum dot has a mixed crystalline structure in which at least two compound crystals are partially separated in the same crystal such as, for example, crystals having a core-shell structure or crystals having a gradient structure. In one exemplary embodiment the quantum dot may include an alloy of at least two nanocrystal compounds.

In one exemplary embodiment the quantum dot may have a core-shell structure including a core and a shell covering the core. The core may include at least one selected from the group consisting of CdSe, CdS, ZnS, ZnSe, CdTe, CdSeTe, CdZnS, PbSe, AgInZnS, ZnO and any mixtures thereof, but is not limited thereto. The shell may include at least one selected from the group consisting of CdSe, ZnSe, ZnS, ZnTe, CdTe, PbS, TiO, SrSe, HgSe and any mixtures thereof, but is not limited thereto.

In exemplary embodiments an average particle diameter of the core of the core-shell quantum dot may be in the range of about 2 nanometers (nm) to about 5 nm. Meanwhile, in exemplary embodiments an average thickness of the shell may be in the range of about 3 nm to about 5 nm. In addition, in exemplary embodiments an average particle diameter of the quantum dot may be in the range of about 5 nm to about 10 nm. If the average particle size and/or the average thickness of the core, the shell and the quantum dot are within the range described above, the quantum dot may have excellent characteristics and excellent dispersibility in a composition for forming patterns. The luminescent color and/or semiconductor characteristics of the quantum dot may be varied by controlling the particle diameter of the core, the thickness of the shell and the average particle diameter of the quantum dot.

Exemplary embodiments of the photosensitive quantum dot may include, but are not limited to Compound 1, Compound 2 and Compound 3 below.

In Compounds 1 to 3, only a few (e.g., 4 photosensitive moieties) of the possible photosensitive moieties, which are bound to the surface of the CdSe quantum dot or the CdSe/ZnS quantum dot, are illustrated for convenience of understanding. Thus, the photosensitive quantum dots are not limited to the number of photosensitive moieties illustrated in Compounds 1 to 3. In addition, it would have been understood by one of ordinary skill in the art that the additional photosensitive moieties, which are not illustrated in Compounds 1 to 3, may be three-dimensionally bound to the surface of the CdSe quantum dot or the CdSe/ZnS quantum dot. Therefore, the photosensitive moieties may not all lie in the same plane but instead may be distributed over the entire surface of the quantum dot. The quantum dot of Compound 3 is a CdSd (core)/ZnS(shell) quantum dot.

In exemplary embodiments the photosensitive quantum dot may be synthesized by synthesizing a quantum dot using any known method, introducing a -$L_1$-$Q_1$-linking group or a -$L_2$-$Q_3$-linking group to a surface of the synthesized quantum dot in order to synthesize Intermediate A or Intermediate B. Intermediate A or Intermediate B is then mixed either with silane A as shown in Reaction Scheme 1 below or with silane B as shown in Reaction Scheme 2 below.

Compound 1

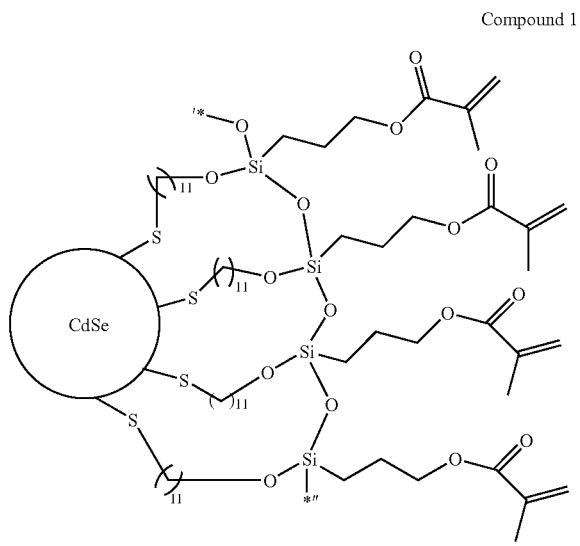

Compound 2

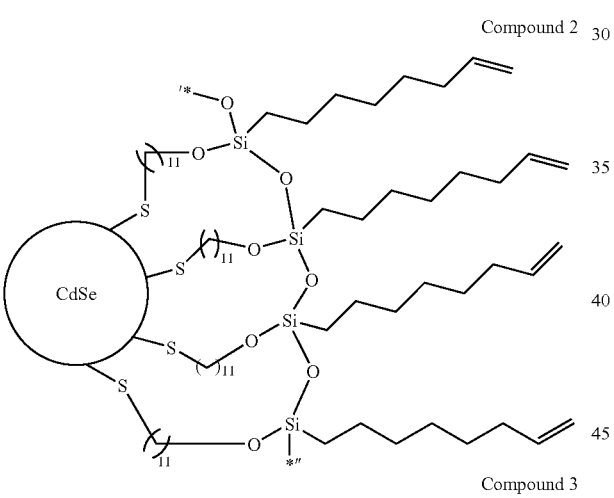

Compound 3

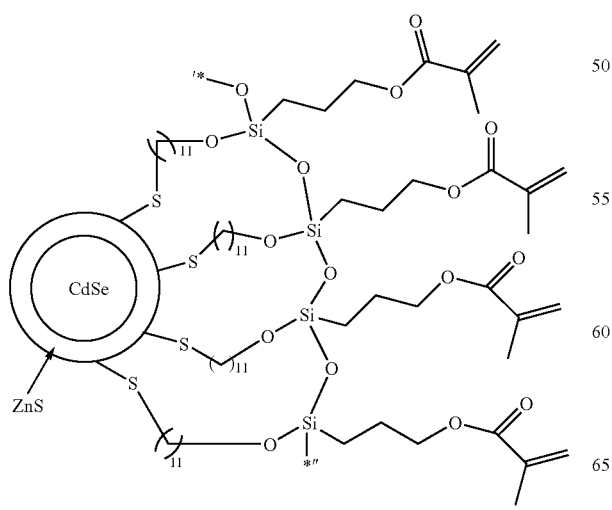

Reaction Scheme 1

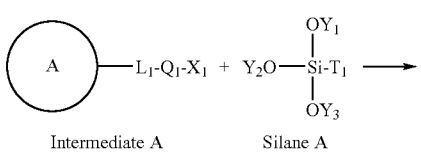

Formula 4

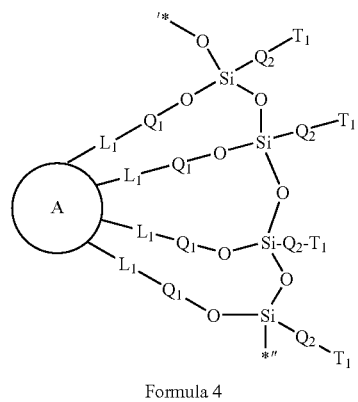

Reaction Scheme 2

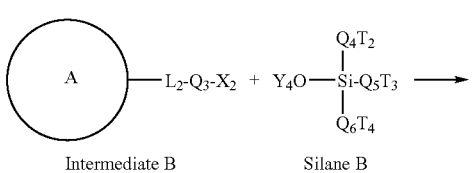

-continued

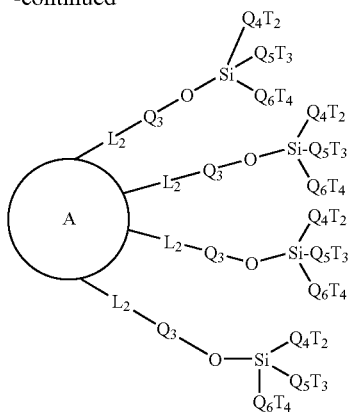

Formula 5

In Reaction Scheme 1 and Reaction Scheme 2, the detailed descriptions of $L_1$, $L_2$, $Q_1$ through $Q_6$, $T_1$ through $T_4$, *' and *'' are the same as defined above.

In exemplary embodiments of Reaction Scheme 1 and Reaction Scheme 2, $X_1$ and $X_2$ may each independently be a hydroxyl group.

In exemplary embodiments of Reaction Scheme 1 and Reaction Scheme 2, $Y_1$ through $Y_4$ may each independently be hydrogen or a $C_1$-$C_{20}$ alkyl group, but are not limited thereto.

In exemplary embodiments examples of the silane A may include 3-(trimethoxysilyl)methyl acrylate, 3-(trimethoxysilyl)ethyl acrylate, 3-(trimethoxysilyl)propyl acrylate, 3-(trimethoxysilyl)methyl methacrylate, 3-(trimethoxysilyl)ethyl methacrylate, 3-(trimethoxysilyl)propyl methacrylate, 3-(triethoxysilyl)methyl acrylate, 3-(triethoxysilyl)ethyl acrylate, 3-(triethoxysilyl)propyl acrylate, 3-(triethoxysilyl)methyl methacrylate, 3-(triethoxysilyl)ethyl methacrylate, 3-(triethoxysilyl)propyl methacrylate, trimethoxy(vinyl)silane, triethoxy(vinyl)silane, allyltrimethoxysilane, allyltriethoxysilane, (3-butene-1-yl)trimethoxysilane, (3-butene-1-yl)triethoxysilane, (4-pentene-1-yl)trimethoxysilane, (4-pentene-1-yl)triethoxysilane, (5-hexene-1-yl)trimethoxysilane, (5-hexene-1-yl)triethoxysilane, (6-heptene-1-yl)trimethoxysilane, (5-hexene-1-yl)triethoxysilane, (7-octene-1-yl)trimethoxysilane, (7-octene-1-yl)triethoxysilane or any mixture thereof.

In exemplary embodiments examples of the silane B may include methoxytrivinylsilane, dimethoxydivinylsilane, ethoxytrivinylsilane, diethoxydivinylsilane, triallylmethoxysilane, diallyldimethoxysilane, triallylethoxysilane, diallyldiethoxysilane or any mixture thereof.

According to another exemplary embodiment, a composition for forming a quantum dot-containing pattern, including the photosensitive quantum dot described above, a photoinitiator and a solvent is provided.

A detailed description of the photosensitive quantum dot in the composition for forming a quantum dot-containing pattern is the same as described above.

In exemplary embodiments the photoinitiator initiates a crosslinking and/or curing reaction between photosensitive functional groups and/or a photosensitive material in the composition for forming a quantum dot-containing pattern. The photoinitiator may be an acetophenone-based, a benzoin-based, a benzophenone-based, a thioxanetone-based photoinitiator or any mixture thereof. The acetophenone-based photoinitiator may be 4-phenoxy dichloroacetophenone, 4-t-butyl dichloroacetophenone, 4-t-butyl trichloroacetophenone, 2,2-diethoxyacetophenone, 2-hydroxy-2-methyl-1-phenyl-propane-1-one, 1-(4-isopropylphenyl)-2-hydroxy-2-methyl-propane-1-one, 1-(4-dodecylphenyl)-2-hydroxy-2-methylpropane-1-one, 4-(2-hydroxyethoxy)-phenyl-(2-hydroxy-2-propyl)ketone, 1-hydroxy cyclohexyl phenyl ketone, 2-methyl-1-[4-(methylthio)phenyl]-2-morpholino-propane-1, or any mixture thereof, but is not limited thereto. The benzoin-based photoinitiator may be benzoin, benzoin methyl ether, benzoin ethyl ether, benzoin isopropyl ether, benzoin isobutyl ether, benzyl dimethyl ketal or any mixture thereof, but is not limited thereto. The benzophenone-based photoinitiator may be benzophenone, benzoyl benzoic acid, benzoyl benzoic acid methyl ester, 4-phenyl benzophenone, hydroxy benzophenone, 4-benzoyl-4'-methyl diphenyl sulphide, 3,3'-dimethyl-4-methoxy benzophenone, or any mixture thereof, but is not limited thereto.

The amount of the photoinitiator is not particularly limited and may be selected within an appropriate range, taking into consideration initiating performance of the photoinitiator and the size of a quantum dot-containing pattern to be formed.

The solvent is a general organic solvent for forming a quantum dot-containing pattern. For example, the solvent includes at least one selected from dimethylformamide ("DMF"), 4-hydroxy-4-methyl-2-pentanone, ethylene glycol monoethyl ether, 2-methoxyethanol, chloroform, chlorobenzene, toluene, tetrahydrofurane, dichloromethane, hexane, heptane, octane, nonane decane and any mixture thereof, but is not limited thereto.

In exemplary embodiments the composition for forming a quantum dot-containing pattern may further include at least one of a photosensitive material and a two photon absorption material.

In exemplary embodiments the photosensitive material participates in the crosslinking and/or curing reaction during exposure to light. In exemplary embodiments the photosensitive material crosslinks with or otherwise cures a photosensitive functional group bound to the surface of the photosensitive quantum dot. Thus, the photosensitive material may increase the resolution of the quantum dot-containing pattern and the durability of the photo-cured product of the photosensitive quantum dot.

In exemplary embodiments, examples of the photosensitive material include, but are not limited to, a multi-functional acrylate-based compound that contains at least one of an acryl group and a vinyl group, a multi-functional polyalkyleneoxide, a polysiloxane-based polymer and any mixtures thereof.

In exemplary embodiments examples of the photosensitive material include urethane acrylate, allyloxylated cyclohexyl diacrylate, bis(acryloxy ethyl)hydroxyl isocyanurate, bis(acryloxy neopentylglycol)adipate, bisphenol A diacrylate, bisphenol A dimethacrylate, 1,4-butanediol diacrylate, 1,4-butanediol dimethacrylate, 1,3-butyleneglycol diacrylate, 1,3-butyleneglycol dimethacrylate, dicyclopentanyl diacrylate, diethyleneglycol diacrylate, diethyleneglycol dimethacrylate, dipentaerythritol hexaacrylate, dipentaerythritol monohydroxy pentacrylate, ditrimethylolpropane tetraacrylate, ethyleneglycol dimethacrylate, glycerol methacrylate, 1,6-hexanediol diacrylate, neopentylglycol dimethacrylate, neopentylglycol hydroxypivalate diacrylate, pentaerythritol triacrylate, pentaerythritol tetraacrylate, phosphoric acid dimethacrylate, polyethyleneglycol diacrylate, polypropyleneglycol diacrylate, tetraethyleneglycol diacrylate, tetrabromobisphenol A diacrylate, triethyleneglycol divinylether, triglycerol diacrylate, trimethylolpropane triacrylate, tripropyleneglycol diacrylate, tris(acryloxyethyl)isocyanurate, phosphoric acid triacrylate, phosphoric acid diacrylate, acrylic acid propargyl ester, vinyl teminated polydimethylsiloxane, vinyl teminated diphenylsiloxane-dimethylsiloxane copolymer, vinyl teminated polyphenylmethylsiloxane, vinyl teminated trifluoromethylsiloxane-dimethylsiloxane copolymer, vinyl teminated diethylsiloxane-dimethylsiloxane copolymer, vinylmethylsiloxane, monomethacryloyloxypropyl terminated polydimethyl siloxane, monovinyl terminated polydimethyl siloxane, monoallyl-mono trimethylsiloxy terminated polyethylene oxide and any mixtures thereof.

The amount of the photosensitive material is not particularly limited and may be appropriately selected, taking into consideration photocuring properties (e.g., curing rate, state of a cured film) and the number of photosensitive functional groups bound to the surface of the photosensitive quantum dot.

In one exemplary embodiment the two photon absorption material may be included in the composition for forming a quantum dot-containing pattern, thereby inducing a curing reaction by two-photon absorption during exposure to light. Two-photon absorption is a process wherein two photons are absorbed by only a portion of the composition by using a focused laser having a very high peak power light beam. Therefore, initiating the curing reaction by using the two-photon absorption process results in a curing process that occurs only in the portion of the composition where the light beam is focused. This allows for excellent accuracy when initiating the curing process only in the desired portion of the composition. For example, accuracy may be obtained to a level of tens of nanometers, more specifically accuracy to a level of about ten nanometers to about 100 nanometers may be obtained. In addition, a light absorption amount may be secondarily increased by the two-photon absorption according to the intensity of an incident light. Therefore, although the focus point of the incident light is formed inside the target to be exposed to the light, the light absorption amount is not decreased. Accordingly, even molecules inside the subject to be exposed to light may be selectively excited by the two-photon absorption process. Therefore, very precise three-dimensional patterns may be formed by the curing reaction using the two-photon absorption process.

In exemplary embodiments the two photon absorption material may be selected from known materials which may induce the curing reaction by two-photon absorption.

In exemplary embodiments examples of the two photon absorption material include, but are not limited to, a cyanine-based material, a merocyanine-based material, an oxonol-based material, a phthalocyanine-based material, an azo-based material, a fluorene-based material, a thiophene-based material, a diphenylethene-based material, a phenoxazine-based material and any mixture thereof.

In exemplary embodiments examples of the two photon absorption material may include compounds represented by Formulas 7 through 12 below, but are not limited thereto:

Formula 7

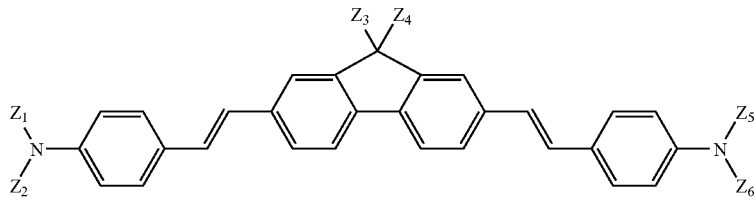

Formula 8

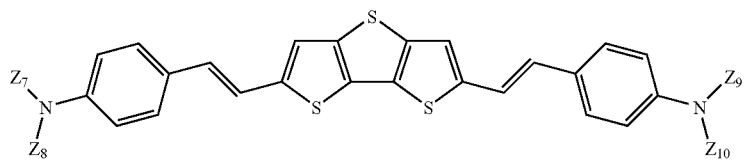

Formula 9

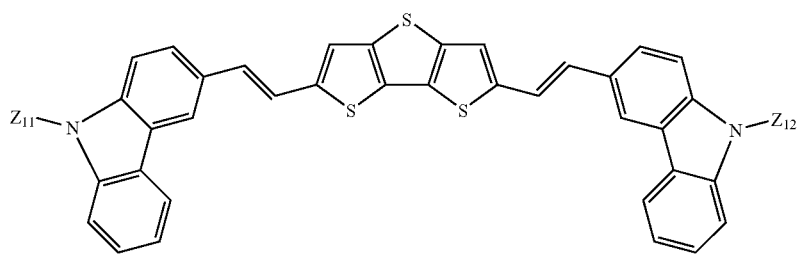

Formula 10

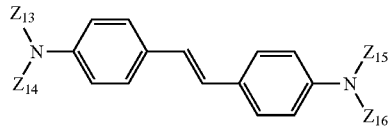

Formula 11

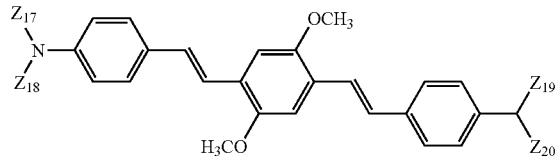

-continued

Formula 12

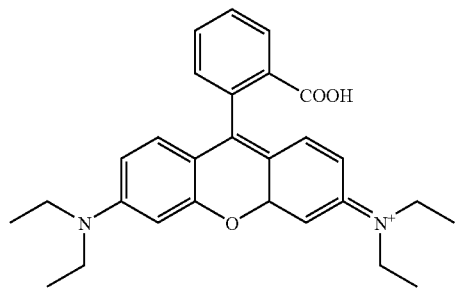

In exemplary embodiments of Formulas 7 through 11, $Z_1$ through $Z_{20}$ are each independently a $C_1$-$C_{10}$ alkyl group or a $C_6$-$C_{14}$ aryl group.

In exemplary embodiments examples of the compound represented by one of Formulas 7 through 11 include compounds represented by the following Compounds 4 through 10, but are not limited thereto.

Compound 4

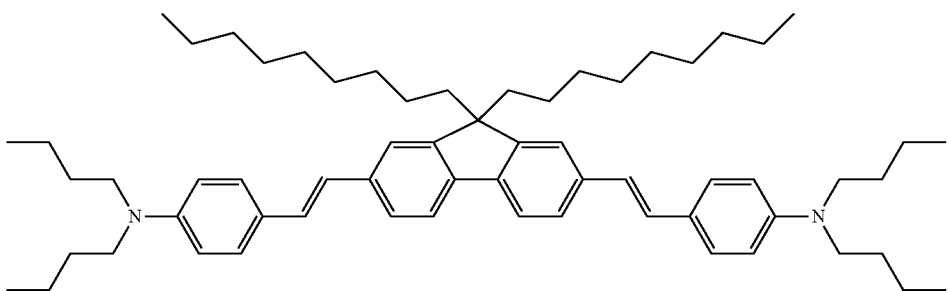

Compound 5

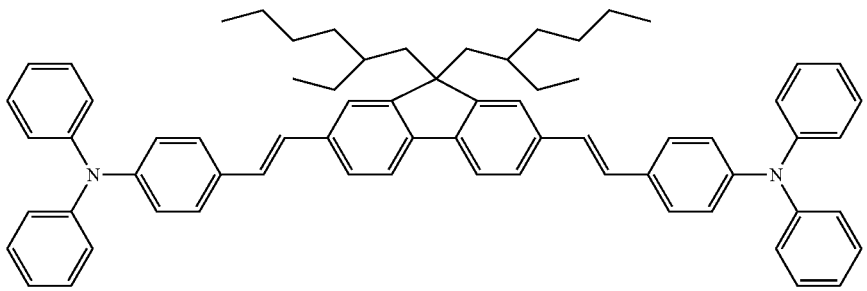

Compound 6

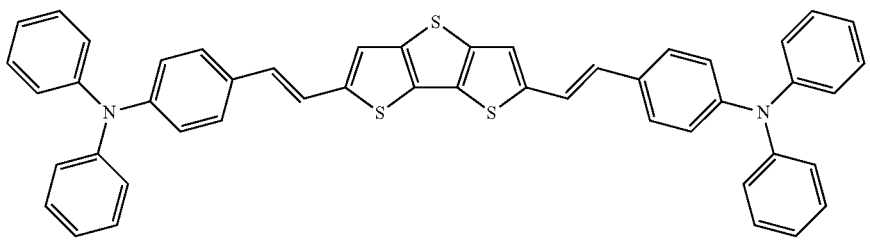

Compound 7

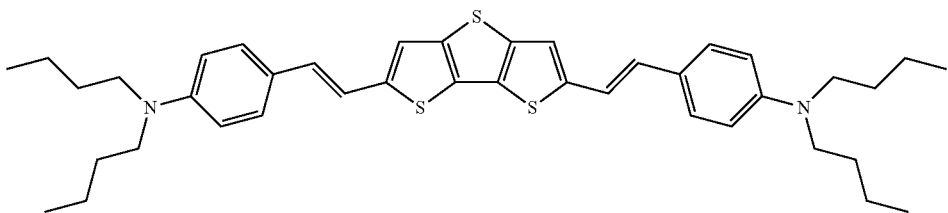

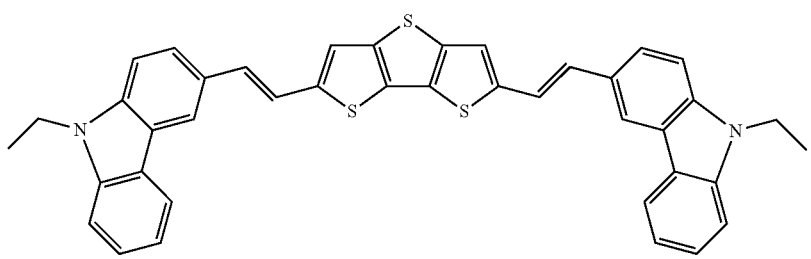

Compound 8

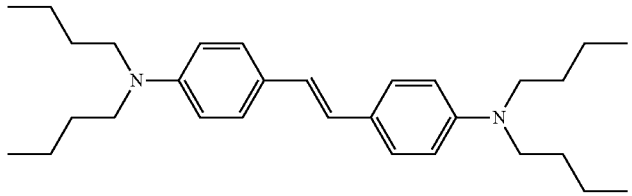

Compound 9

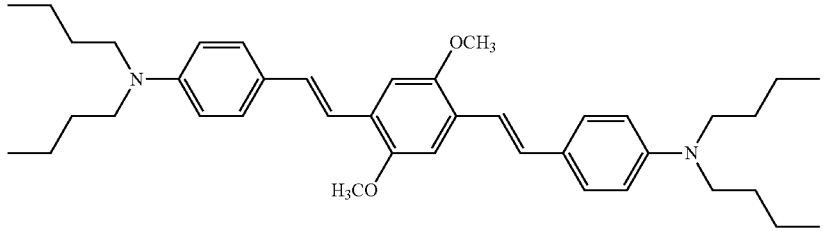

Compound 10

The compound of Formula 12 is referred to as Rhodamine B.

The amount of the two photon absorption material is not particularly limited and may be appropriately selected, taking into consideration photon absorption performance of the two photon absorption material, the energy of the used laser beam and the size of a quantum dot-containing pattern to be formed.

The photosensitive quantum dot included in the composition for forming a quantum dot-containing pattern has the photosensitive moieties as described above on the surface thereof, and thus the photosensitive quantum dot has excellent dispersibility.

A method of forming a quantum dot-containing pattern, according to another exemplary embodiment includes preparing the composition for forming a quantum dot-containing pattern as described above, applying the composition for forming a quantum dot-containing pattern onto a substrate to form a quantum dot-containing film, selectively exposing the quantum dot-containing film to light and developing the light-exposed quantum dot-containing film to obtain a quantum dot-containing pattern.

The detailed description of the composition for forming a quantum dot-containing pattern is the same as described above.

In exemplary embodiments the application of the composition for forming a quantum dot-containing pattern onto the substrate may be performed by spin coating, dip coating, roll coating, screen coating, spray coating, flow coating, inkjet vapor jetting, drop casting or blade coating, but the method is not limited thereto. In exemplary embodiments at least a portion of the solvent included in the composition for forming a quantum dot-containing pattern, which is applied onto the substrate, is removed to obtain the quantum dot-containing film. A prebaking for the removal of the solvent may be performed at a temperature in the range of about 30 to about 300 degrees Celsius (° C.), for example, in the range of about 40 to about 120° C. Although the prebaking temperature ranges vary according to the amount of the solvent included in the composition for forming a quantum dot-containing pattern. However, the prebaking temperature is not limited thereto.

Next, the quantum dot-containing film is selectively exposed to light according to a pattern.

In exemplary embodiments the quantum dot-containing film may be selectively (e.g., exposed according to the pattern of a photomask) exposed to light in the presence of a photomask having a certain pattern. In this exemplary embodiment, crosslinking and/or curing reactions occur between the photosensitive functional group and the photosensitive material in the light-exposed portion, and thus a solubility difference between the light-exposed portion and the non-light-exposed portion occurs. Thus, the light-exposed and the non-light-exposed portions are treated with a developing solution in the subsequent developing process to obtain the quantum dot-containing pattern. The light exposure process may be performed by contact light exposure or by non-contact light exposure and the light exposure amount is not particularly limited and may be appropriately selected according to a desired thickness of the quantum dot-containing film. For example, in one exemplary embodiment the light exposure amount may be in the range of about 50 millijoules per square centimeter ($mJ/cm^2$) to about 850 $mJ/cm^2$, but is not limited thereto. If the light exposure amount is insufficient, the crosslinking reaction may not be fully performed, or photo bleaching may occur, and thus the light emitting efficiency of the quantum dot-containing pattern may decrease.

In exemplary embodiments, a three-dimensional quantum dot-containing pattern may be obtained using a laser beam and a device, which may induce a curing reaction by two-photon absorption, that is, two-photon polymerization in the light exposure process. For the formation of the 3-dimensional quantum dot-containing pattern, the composition for forming a quantum dot-containing pattern may, as described above, further include the two photon absorption material.

In exemplary embodiments a light exposure process for the two-photon polymerization may be performed using any known laser beam and device and any known operation method thereof.

In exemplary embodiments, the laser device may include two galvano mirrors, which may focus laser beams in horizontal and vertical directions, and a lens having an aperture ratio. The laser beam that is focused by the galvano mirrors is passed through the lens in order to reach the quantum dot-containing film. In exemplary embodiments the laser device may further include a camera for confirming the fabricating process of the quantum dot-containing pattern. In addition, an available wavelength of the laser beam may be varied according to a component and the size of a pattern to be formed. For example, a Ti:sapphire laser beam with a wavelength of 780 nm may be used. An irradiation time of the laser beam may be controlled by a galvano shutter and a pinhole and, for example, may be controlled to a level of about 10 milliseconds (ms).

As described above, the solubility difference between the light-exposed portion and the non-light-exposed portion of the quantum dot-containing film that is selectively exposed to light according to the pattern is obtained. Thus, the quantum dot-containing film that is selectively exposed to light according to the pattern is developed using an appropriate developing solution to obtain the quantum dot-containing pattern. In exemplary embodiments the developing solution includes, but is not limited to an organic solvent, such as toluene, chloroform and propylene glycol methyl ether acetone ("PGMEA"); a weak acidic or weak basic solution; pure water and any mixtures thereof.

According to another exemplary embodiment, a quantum dot-containing pattern including a photo-cured product of the photosensitive quantum dot described above is provided. The term "quantum dot-containing pattern" used herein refers to a structural body, which includes a quantum dot and has a certain shape. In exemplary embodiments the quantum dot-containing pattern may have a two-dimensional or three-dimensional shape and may have a variety of shapes used in various devices that have a need for the quantum dot-containing pattern.

In exemplary embodiments the size of the quantum dot-containing pattern may be about 1000 micrometers or less and, for example, about 100 micrometers or less. Particularly, the size of the quantum dot-containing pattern may be about 10 micrometers or less. More particularly, the size of the quantum dot-containing pattern may be about 1 micrometer or less.

The term "the size of the quantum dot-containing pattern" used herein may be interpreted to represent at least one measurement of length, width, height and diameter of the quantum dot-containing pattern. The quantum dot-containing pattern may be prepared using the composition for forming a quantum dot-containing pattern described above.

The quantum dot in the quantum dot-containing pattern has Si on the surface thereof, and thus the oxidation of the quantum dot is prevented by the Si. Accordingly, a decrease in the light emitting efficiency of the quantum dot according to time may be prevented.

According to another embodiment, an electric device including the quantum dot-containing pattern including a photo-cured product of the photosensitive quantum dot described above is provided.

In one exemplary embodiment, the electric device may be a light emitting device, which includes a pair of electrodes and an emissive layer interposed between the pair of electrodes. In this example, the emissive layer has the quantum dot-containing pattern. In another exemplary embodiment the electric device may be an organic light emitting device, which includes a pair of electrodes and at least an emissive layer between the pair of electrodes. The electric device further includes a color filter layer and/or a color conversion layer. In this embodiment, the color filter layer and/or the color conversion layer has the quantum dot-containing pattern.

In addition, in other exemplary embodiments the electric device may be light emitting diodes ("LEDs"), lasers, holographic devices, sensors, solar cells, photodetectors or transistors, which may use light emitting properties of the quantum dot-containing pattern, but the electric device is not limited thereto.

One or more exemplary embodiments will be described in further detail with reference to the following examples. The examples are for illustrative purposes only and are not intended to limit the scope of the one or more exemplary embodiments.

EXAMPLES

Synthesis Example 1

Synthesis of Compound 1

Synthesis of CdSe Quantum Dots

Thirty (30) milligrams (mg) of selenium (Se) powder was dissolved in 0.4 milliliters (ml) of trioctylphosphine under sonication to prepare a Se solution. The Se solution was then diluted with 5 ml of 1-octadecene. A mixture of 13 mg of CdO, 0.6 ml of oleic acid and 10 ml of 1-octadecene was added to a reaction flask. The mixture was then heated at about 225° C. to obtain an optically transparent solution. The prepared Se solution was added to the resultant solution and heated again to 225° C. Subsequently, the reaction flask was cooled to room temperature to obtain oleic acid-stabilized CdSe quantum dots.

Ligand Substitution of CdSe Quantum Dots

Five (5) mg of the oleic acid-stabilized CdSe quantum dots and 50 mg of 1-mercapto-1-undecanol were mixed with 5 ml of chloroform and 5 ml of ethanol. The mixture was then sonicated for 3 hours. Then, 40 ml of chloroform was added to the mixture to obtain a precipitate of 11-mercapto-1-undecanol capped CdSe quantum dots. The precipitate was dissolved in ethanol and dimethyl sulfoxide ("DMSO").

Synthesis of CdSe Quantum Dots with Si and Photosensitive Functional Group

Five (5) mg of the 11-mercapto-1-undecanol capped CdSe quantum dots were mixed with 5 ml of dry DMSO and then 500 microliters (μl) of 3-(trimethoxysilyl)propyl methacrylate were added to the mixture. Then, the resultant mixture was stirred at 50° C. for 6 hours. The resultant was centrifuged and precipitated with chloroform. The obtained precipitate was washed with methanol and chloroform to obtain Compound 1.

Compound 1 was observed using a transmission electron microscope ("TEM") and as a result it was confirmed that Compound 1 had a particle diameter of 3.3±0.1 nm.

Synthesis Example 2

Synthesis of Compound 2

Compound 2 was prepared in the same manner as in Synthesis Example 1, except that (7-octene-1-yl)trimethoxysilane was used instead of 3-(trimethoxysilyl)propyl methacrylate.

Synthesis Example 3

Synthesis of Compound 3

Synthesis of CdSe(Core)/ZnS(Shell) Quantum Dot

CdO (0.4 micromoles (mmol)), zinc acetate (4 mmol), 5.5 ml of oleic acid and 20 ml of 1-octadecene were added to a reactor and heated at 150° C. The mixture was left to sit in a vacuum at 100 millitorrs (mTorr) for 20 minutes in order to remove acetic acid generated by substituting acetate of the zinc acetate with oleic acid from the resultant. Then, the resultant was heated at 310° C. to obtain a transparent mixture, which was maintained at 310° C. for 20 minutes. Then, a Se and S solution prepared by dissolving 0.4 mmol Se powder and 2.3 mmol S powder in 3 ml of trioctylphosphine was added to a reactor containing a $Cd(OA)_2$ and $Zn(OA)_2$ solution. The mixture was grown at 310° C. for 5 minutes and then the crystal growth was stopped using an ice bath. Then, the mixture was subjected to precipitation and the quantum dot was isolated using centrifugation. The remaining impurities were washed using chloroform and ethanol to obtain a CdSe(core)/ZnS(shell) quantum dot stabilized by oleic acid.

Substitution of Ligand of CdSe/ZnS Quantum Dot

Five (5) mg of CdSe/ZnS quantum dots substituted with oleic acid and 50 mg of 11-mercapto-1-undecanol were mixed with 5 ml of chloroform and 5 ml of ethanol and the resultant was sonicated for 3 hours. Forty (40) ml of chloroform was added to the mixture to obtain a precipitate of 11-mercapto-1-undecanol capped CdSe/ZnS quantum dots. Excessive ligand was removed using centrifugation and the impurities were removed from the quantum dots using ethanol and toluene.

Synthesis of CdSe/ZnS Quantum Dots Including Si and a Photosensitive Functional Group Twenty (20) mg of 11-mercapto-1-undecanol capped CdSe/ZnS quantum dots were mixed with 5 ml of dry DMSO and then 100 μl of 3-(trimethoxysilyl)propyl methacrylate was added to the mixture. Then, the mixture was stirred at 50° C. for 6 hours. A precipitate prepared by adding excess chloroform to the resultant was then washed with ethanol and chloroform to obtain Compound 3.

Compound 3 was observed using a TEM and as a result, it was confirmed that Compound 3 had a particle diameter in the range of about 3 to about 7 nm.

Example 1

Formation of Quantum Dot-Containing Pattern Having a Three-Dimensional Shape (I)

One-tenth (0.1) gram (g) of a toluene dispersion of Compound 1 (1 weight percent (wt %)), 0.1 g of 2,2-diethoxyacetophenone as a photoinitiator, 0.01 g of Rhodamine B as a two photon absorption material and 5 g of SCR 500 (manufactured by JSR, Japan, urethaneacrylate) as a photosensitive material were mixed together. The mixture was dropped on a glass substrate that was cleaned with isopropyl alcohol ("IPA") and the resultant was spin-coated at 500 revolutions per minute ("rpm") for 5 seconds and at 3000 rpm for 30 seconds. The resultant was then dried in a heating plate at 65° C. for 1 minute and subsequently heat-treated in the heating plate at 95° C. for 15 minutes to remove the solvent from the resultant. As a result, a film including Compound 1 was obtained.

To form a desired three-dimensional pattern in the obtained film, the x-axis and y-axis were controlled using a Galvano scanner having a resolution of 1.2 nm with respect to a Ti:Sapphire laser beam having a wavelength of 780 nm. Two Galvano mirrors allowed laser beams in both the horizontal and vertical directions to transmit through a lens having a constant aperture ratio at an interval of 80 femtoseconds (fs), and thus the laser beams were incident on the film to induce a curing reaction of the film including Compound 1 at a constant rate. The control of a laser beam with respect to a z-axis direction was performed using a piezoelectric stage and a deposition interval was controlled to a level of 10 nm. An irradiation time of the laser beam was controlled to a level of 1 ms in the combination of a Galvano shutter and a pinhole. The manufacturing process was monitored using a charge-coupled device ("CCD") camera equipped with a high magnification lens (×1000). A three-dimensional image was prepared by continuously forming voxels according to a two-dimensional plane coordinate to prepare one layer, and then moving the piezoelectric stage in the z-axis direction to as thick as the deposition thickness to prepare another layer.

After the curing process according to the three-dimensional pattern was terminated, the resultant was developed using PGMEA and then washed using IPA to obtain the quantum dot-containing pattern illustrated in FIG. 1.

Example 2

Formation of Quantum Dot-Containing Pattern Having a Three-Dimensional Shape (II)

Figure 2:
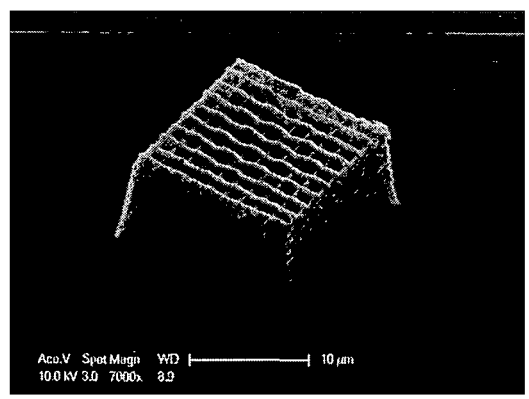
FIG. 2 is an image of a quantum dot-containing pattern having a three-dimensional shape, prepared in accordance with Example 3, using another exemplary embodiment of a photosensitive quantum dot.

A quantum dot-containing pattern (e.g., CdSe/ZnS quantum dot-containing pattern) shown in FIG. 2 was obtained in the same manner as in Example 1 except that Compound 3 was used instead of Compound 1.

Figure 3:
FIG. 3 is a photograph illustrating the photoluminescence ("PL") of a quantum dot-containing pattern having a three-dimensional shape, prepared using another exemplary embodiment of a photosensitive quantum dot.

The PL of the quantum dot-containing pattern was measured using a Fluoro Max-2 fluorescence spectrophotometer and a Fluorescence spectrometer (F-7000, HITACHI Co.). The results of the measurements are shown in FIG. 3. Referring to FIG. 3, it was confirmed that a quantum dot was dispersed in the quantum dot-containing pattern.

As described above, according to the one or more of the above embodiments, a quantum dot-containing pattern with excellent resolution and a long life span may be obtained.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

What is claimed is:
1. A photosensitive quantum, dot comprising:
  a quantum dot; and
  a plurality of photosensitive moieties that are bound to a surface of the quantum dot, wherein each of the photosensitive moieties comprises silicon and a photosensitive functional group,
  wherein each of the photosensitive moieties is represented by a formula selected from the group consisting of Formula 1 and Formula 2:

Formula 1

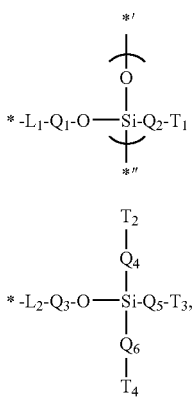

Formula 2

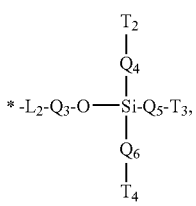

wherein * is a binding site with the surface of the quantum dot;
$L_1$ and $L_2$ are each independently a linking group selected from the group consisting of —S—, —$R_1$—S—, —N=C—, —$R_1$=N—, —OOC—, —$R_1$—OOC— and —O—POO$R_1R_2$—, wherein $R_1$ and $R_2$ each independently hydrogen or —$(CH_2)_p$—, and p is an integer in the range of 1 to about 10;
$Q_1$ through $Q_6$ are each independently a single bond or a linking group of —$[C(R_3)(R_4)]_q$—, wherein $R_3$ and $R_4$ each independently hydrogen, a $C_1$-$C_{20}$ alkyl group, or —OH, wherein at least one of the —$C(R_3)(R_4)$— groups is replaced with a group selected from the group consisting of —COO—, —NHCO—, —OCO—, —O— and —S—, wherein q is an integer in the range of 1 to about 20;
$T_1$ is a photosensitive functional group that is photocrosslinkable or photocurable upon exposure to light;
$T_2$ through $T_4$ are each independently selected from the group consisting of hydrogen, a substituted or unsubstituted $C_1$-$C_{20}$ alkyl group, a substituted or unsubstituted $C_2$-$C_{20}$ alkenyl group, a substituted or unsubstituted $C_6$-$C_{14}$ aryl group and a photosensitive functional group that is photocrosslinkable or photocurable upon exposure to light, wherein at least one of $T_2$ through $T_4$ is a photosensitive functional group that is photocrosslinkable or photocurable upon exposure to light, and a substituent of the $C_1$-$C_{20}$ alkyl group, $C_2$-$C_{20}$, alkenyl group and $C_6$-$C_{14}$ aryl group is selected from the group consisting of a hydroxyl group, a halogen atom, an amino group, a thiol group, a $C_1$-$C_{10}$ alkyl group and a $C_6$-$C_{14}$, aryl group;
*' is a binding site between a first photosensitive moiety of Formula 1 and a silicon of an adjacent photosensitive moiety represented by Formula 1;
*'' is a binding site between a first photosensitive moiety of Formula 1 and an oxygen of an adjacent photosensitive moiety represented by Formula 1; and
wherein the photosensitive functional group is represented by Formula 3:

$$—CR_5=CR_6R_7 \quad \text{Formula 3}$$

wherein $R_5$ through $R_7$ are each independently represented by one selected from the group consisting of hydrogen, a $C_1$-$C_{10}$ alkyl group, a $C_2$-$C_{10}$ alkenyl group, a $C_6$-$C_{10}$ aryl group, a $C_1$-$C_{10}$ alkyl group substituted with at least one selected from a group consisting of a halogen atom, a $C_2$-$C_{10}$ alkenyl group substituted with at least one of a halogen atom, —CN, —COOH and an amino group.

2. The photosensitive quantum dot of claim 1, wherein $L_1$ and $L_2$ are each independently —S— or —$R_1$—S—.

3. The photosensitive quantum dot of claim 1, wherein $R_3$ and $R_4$ are each independently hydrogen.

4. The photosensitive quantum dot of claim 1, wherein at least one of the —$C(R_3)(R_4)$— group is replaced with —COO—.

5. The photosensitive quantum dot of claim 1, wherein the photosensitive quantum dot is represented by a formula selected from the group consisting of Formula 4 and Formula 5:

Formula 4

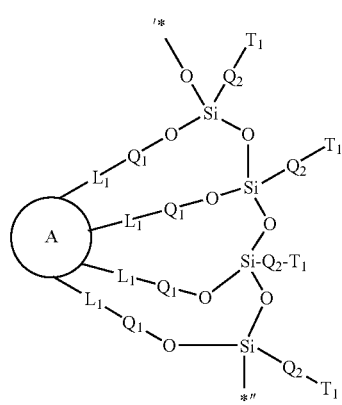

Formula 5

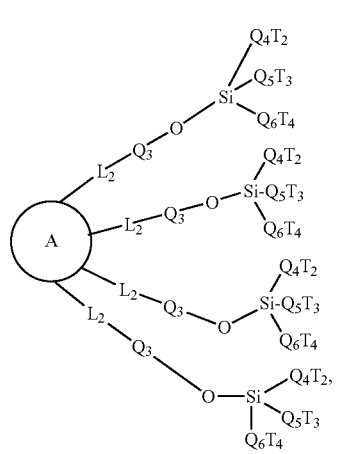

wherein A denotes a quantum dot.

6. The photosensitive quantum dot of claim 1, wherein the quantum dot comprises at least one selected from the group consisting of CdS, CdSe, CdTe, ZnS, ZnSe, ZnTe, HgS, HgSe, HgTe, GaN, GaP, GaAs, InP, InAs and any mixtures thereof.

7. The photosensitive quantum dot of claim 1, wherein the quantum dot comprises a core and a shell covering the core.

8. The photosensitive quantum dot of claim 7, wherein the core comprises at least one selected from the group consisting, of CdSe, CdS, ZnS, ZnSe, CdTe, CdSeTe, CdZnS, PhSe, AgInZnS, ZnO and any mixtures thereof; and the shell comprises at least one selected from the group consisting of CdSe, ZnSe, ZnS, ZnTe, CdTe, PbS, TiO, SrSe, HgSe and any mixtures thereof.

9. A composition for forming a quantum dot-containing pattern, the composition comprising the photosensitive quantum dot according to claim 1, a photoinitiator and a solvent.

10. The composition for forming a quantum dot-containing pattern of claim 9, further comprising at least one of a photosensitive material and a two photon absorption material.

11. The composition for forming a quantum dot-containing pattern of claim 9, further comprising a two photon absorption material.

12. The composition for forming a quantum dot-containing pattern of claim 10, wherein the photosensitive material is selected from the group consisting of a multi-functional acrylate-based compound that comprises at least one group selected from the group consisting of an acryl group, a vinyl group and any mixtures thereof, a multi-functional polyalkyleneoxide, a polysiloxane-based polymer and any mixtures thereof.

13. A method of forming a quantum dot-containing pattern, comprising:

preparing a composition for forming a quantum dot-containing pattern, wherein the composition comprises a photosensitive quantum dot, a photoinitiator and a solvent, and wherein the photosensitive quantum dot comprises a quantum dot and a plurality of photosensitive moieties that are bound to a surface of the quantum dot;

applying the composition for forming a quantum dot-containing pattern on a substrate to prepare a quantum dot-containing film;

selectively exposing, the quantum dot-containing film to light; and developing the exposed quantum dot-containing film to obtain a quantum dot-containing pattern, wherein each of the photosensitive moieties comprises silicon and a photosensitive functional group that is photocrosslinkable or photocurable upon exposure to light, wherein each of the photosensitive moieties is represented by a formula selected from the group consisting of Formula 1 and Formula 2:

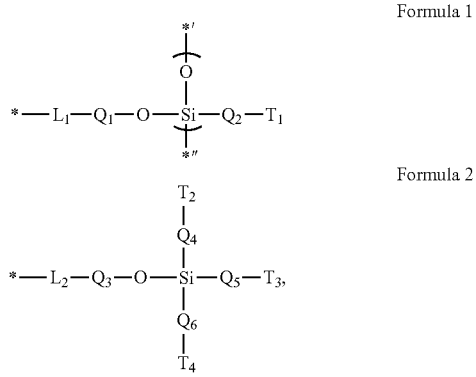

wherein * is a binding site with the surface of the quantum dot;

$L_1$ and $L_2$ are each independently a linking group selected from the group consisting of —S—, —N=C—, —$R_1$=N—, —OOC—, —$R_1$—OOC— and —O—POO$R_1R_2$—, wherein $R_1$ and $R_2$ each independently hydrogen or —(CH$_2$)$_p$—, and p is an integer in the range of 1 to about 10;

$Q_1$ through $Q_6$ are each independently a single bond or a linking group of —[C($R_3$)($R_4$)]$_q$—, wherein $R_3$ and $R_4$ each independently hydrogen, a $C_1$-$C_{20}$ alkyl group, or —OH, wherein at least one of the —C($R_3$)($R_4$)— groups is replaced with a group selected from the group consisting of —COO—, —NHCO—, —OCO—, —O— and —S—, and wherein q is an integer in the range of 1 to about 20;

$T_1$ is a photosensitive functional group that is photocrosslinkable or photocurable upon exposure to light;

$T_2$ through $T_4$ are each independently selected from the group consisting of hydrogen, a substituted or unsubstituted $C_1$-$C_{20}$ alkyl group a substituted or unsubstituted $C_2$-$C_{20}$ alkenyl group, a substituted or unsubstituted $C_6$-$C_{14}$ aryl group and a photosensitive functional group that is photocrosslinkable or photocurable upon exposure to light, wherein at least one of $T_2$ through $T_4$ is a photosensitive functional group that is photocrosslinkable or photocurable upon exposure to light, and a substituent of the $C_1$-$C_{20}$ alkyl group, $C_2$-$C_{20}$ alkenyl group and $C_6$-$C_{14}$ aryl group is selected from the group consisting of a hydroxyl group, a halogen atom, an amino group, a thiol group, a alkyl group $C_1$-$C_{10}$ and a $C_6$-$C_{14}$ aryl group;

*' is a binding site between a first photosensitive moiety of Formula 1 and a silicon of an adjacent photosensitive moiety represented by Formula 1;

*" is a binding site between a first photosensitive moiety of Formula 1 and an oxygen of an adjacent photosensitive moiety represented by Formula 1; and wherein the photosensitive functional group is represented by Formula 3:

wherein $R_5$ through $R_7$ are each independently represented by one selected from the group consisting of hydrogen, a $C_1$-$C_{10}$ alkyl group, a $C_2$-$C_{10}$ alkenyl group, a $C_6$-$C_{14}$ aryl group, a $C_1$-$C_{10}$ alkyl group substituted with at least one selected from a group consisting of a halogen atom, $C_2$-$C_{10}$ alkenyl group substituted with at least one of a halogen atom, —CN, —COOH and an amino group.

14. The method of claim 13, wherein the composition for forming a quantum dot-containing pattern further comprises a two photon absorption material, and during the exposing process, a three-dimensional quantum dot-containing pattern is obtained using a laser beam that induces two-photon polymerization.

15. A quantum dot-containing pattern comprising a photocured product of a photosensitive quantum dot, wherein the photosensitive quantum dot comprises a quantum dot and a plurality of photosensitive moieties that are bound to a surface of the quantum dot, wherein each of the photosensitive moieties comprises silicon and a photosensitive functional group that photocrosslinks or photocures upon exposure to light, wherein each of the photosensitive moieties is represented by a formula selected from the group consisting of Formula 1 and Formula 2:

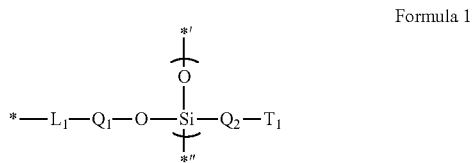

Formula 2

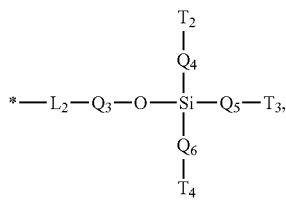

wherein * is a binding site with the surface of the quantum dot;

L₁ and L₂ are each independently a linking group selected from the group consisting of —S—, —R₁—S—, —N=C—, —R₁=N—, —OOC—, —R₁—OOC— and —O—POOR₁R₂—, wherein R₁ and R₂ each independently hydrogen or —(CH₂)$_p$—, and p is an integer in the range of 1 to about 10:

Q₁ through Q₆ are each independently a single bond or a linking group of —[C(R₃)(R₄)]$_q$—, wherein R₃ and R₄ each independently hydrogen, a C₁-C₂₀ alkyl group, or —OH, wherein at least one of the —C(R₃)(R₄)— groups is replaced with a group selected from the group consisting of —COO—, —NHCO—, —OCO—, —O— and —S—, and wherein q is an integer in the range of 1 to about 20;

T₁ is a photosensitive functional group that is photocrosslinkable or photocurable upon exposure to light;

T₂ through T₄ are each independently selected from the group consisting of hydrogen, a substituted or unsubstituted C₁-C₂₀ alkyl group, a substituted or unsubstituted C₂-C₂₀ alkenyl group, a substituted or unsubstituted C₆-C₁₄ aryl group and a photosensitive functional group that is photocrosslinkable or photocurable upon exposure to light, wherein at least one of T₂ through T₄ is a photosensitive functional group that is photocrosslinkable or photocurable upon exposure to light, and a substituent of the C₁-C₂₀ alkyl group, C₂-C₂₀ alkenyl group and C₆-C₁₄ aryl group is selected from the group consisting of a hydroxyl group, a halogen atom, an amino group, a thiol group a C₁-C₁₀ alkyl group and a C₆-C₁₄ aryl group;

*' is a binding site between a first photosensitive moiety of Formula 1 and a silicon of an adjacent photosensitive moiety represented by Formula 1;

*" is a binding site between a first photosensitive moiety of Formula 1 and an oxygen of an adjacent photosensitive moiety represented by Formula 1; and wherein the photosensitive functional group is represented by Formula 3:

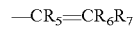   Formula 3 wherein R₅ through R₇ are each independently represented by one selected from the group consisting of hydrogen, a C₁-C₁₀ alkyl group, a C₂-C₁₀ alkenyl group, a C₆-C₁₄ aryl group, a C₁-C₁₀ alkyl group substituted with at least one selected from a group consisting of a halogen atom, a C₂-C₂₀ alkenyl group substituted with at least one of a halogen atom, —CN, —COOH and an amino group.

16. The quantum dot-containing pattern of claim 15, wherein the silicon exists on the surface of the quantum dot in the photo-cured product of the photosensitive quantum dot.

17. An electric device comprising the quantum dot-containing pattern according to claim 15.

18. The electric device of claim 17, wherein the electric device comprises an organic light emitting device that comprises a pair of electrodes and at least an emissive layer between the pair of electrodes, wherein the quantum dot-containing pattern is at least one of a color filter layer and a color conversion layer.

* * * * *